(12) United States Patent
Glenn et al.

(10) Patent No.: US 6,717,126 B1
(45) Date of Patent: Apr. 6, 2004

(54) METHOD OF FABRICATING AND USING AN IMAGE SENSOR PACKAGE WITH REFLECTOR

(75) Inventors: Thomas P. Glenn, Gilbert, AZ (US); Steven Webster, Muntinlupa (PH); Roy Dale Hollaway, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 233 days.

(21) Appl. No.: 09/906,868

(22) Filed: Jul. 16, 2001

(51) Int. Cl.[7] ............................................. H01L 27/00
(52) U.S. Cl. .................... 250/208.1; 250/239
(58) Field of Search ................... 250/208.1, 204, 250/206, 239, 227.11, 216; 257/21, 53, 113, 184, 225, 257, 258, 290, 414; 340/942; 356/222; 359/109; 348/294

(56) References Cited

U.S. PATENT DOCUMENTS

| | | | | |
|---|---|---|---|---|
| 4,853,252 | A | | 8/1989 | Fränkel et al. .............. 427/53.1 |
| 5,040,868 | A | | 8/1991 | Waitl et al. ................... 358/33 |
| 5,047,783 | A | * | 9/1991 | Hugenin ...................... 342/179 |
| 5,357,103 | A | * | 10/1994 | Sasaki ..................... 250/227.24 |
| 5,929,516 | A | | 7/1999 | Heerman et al. ........... 257/701 |
| 6,483,101 | B1 | * | 11/2002 | Webster ....................... 250/216 |

* cited by examiner

*Primary Examiner*—David Porta
*Assistant Examiner*—Patrick J Lee
(74) *Attorney, Agent, or Firm*—Gunnison, McKay & Hodgson, L.L.P.; Serge J. Hodgson

(57) ABSTRACT

A method of capturing an image at an angle to a line of sight an image sensor includes receiving radiation of the image. The received radiation is reflected towards an active area of the image sensor with a first panel of a reflector. The radiation strikes the active area and the image sensor captures the image.

21 Claims, 4 Drawing Sheets

METHOD OF FABRICATING AND USING AN IMAGE SENSOR PACKAGE WITH REFLECTOR

FIELD OF THE INVENTION

The present invention relates generally to the packaging of electronic components. More particularly, the present invention relates to a method of fabricating and using an image sensor package.

BACKGROUND OF THE INVENTION

Image sensor packages are well known to those of skill in the art. For example, digital cameras utilize image sensor packages to capture images.

The image are received by the digital camera as light, sometimes called electromagnetic radiation or simply radiation. This electromagnetic radiation strikes an active area of an image sensor located within the image sensor package. The active area respond to the electromagnetic radiation and the image sensor captured the image in a well-known manner.

To prevent distortion of the electromagnetic radiation and thus the captured image, it is important to accurately align the active area with the received electromagnetic radiation. Generally, the image had to be aligned within the line of sight of the active area. Otherwise, the image would not be received by the active area and thus would not be captured by the image sensor or would otherwise be distorted. Disadvantageously, the image has to be within a very narrow field of view to be captured by the image sensor.

SUMMARY OF THE INVENTION

In accordance with one embodiment of the present invention, an image sensor package includes a substrate and an image sensor coupled to the substrate. The image sensor includes an upper surface having an active area.

A reflector lid is coupled to the substrate. The reflector lid has a first panel having a planar surface. The planar surface is at least partially reflective and is angled relative to the upper surface of the image sensor.

In one embodiment, the reflector lid includes a rectangular annular base and a reflector coupled to the rectangular annular base. The reflector includes the first panel. The rectangular annular base includes projections, which enhance the mounting of the reflector lid to the substrate.

In another embodiment, the reflector lid comprises a reflector having panels. Inner surfaces of the panels define a pyramid shaped inner surface of the reflector. The pyramid shaped inner surface is partially reflective.

Also in accordance with one embodiment of the present invention, a method of capturing an image with an image sensor package includes receiving electromagnetic radiation of the image. The electromagnetic radiation is received at an angle to a line of sight of an image sensor of the image sensor package.

The electromagnetic radiation is reflected towards an active area of the image sensor with a first panel of a reflector of the image sensor package. The electromagnetic radiation strikes the active area and the image sensor captures the image.

Advantageously, since an inner surface of the first panel is planar and the electromagnetic radiation is reflected on this planar inner surface, the first panel does not distorted the image to any appreciable extent. Accordingly, the image sensor package readily captures images at an angle to the line of sight of the image sensor.

In accordance with another embodiment of the present invention, a method of capturing a first image and a second image with an image sensor package includes receiving a first electromagnetic radiation of the first image at an angle to a line of sight of an image sensor of the image sensor package.

At least a first portion of the first electromagnetic radiation is passed through a first partially reflective panel of the image sensor package. At least a second portion of the first electromagnetic radiation is reflected towards an active area of the image sensor with a second partially reflective panel of the image sensor package. The at least a second portion of the first electromagnetic radiation strikes the active area and the image sensor captures the first image.

Similarly, a second electromagnetic radiation of the second image is received at an angle to the line of sight. At least a first portion of the second electromagnetic radiation is passed through the second partially reflective panel. At least a second portion of the second electromagnetic radiation is reflected towards the active area of the image sensor with the first partially reflective panel.

The at least a second portion of the second electromagnetic radiation strikes the active area and the image sensor captures the second image. In one embodiment, the first image and the second image are opposite one another and are captured simultaneously.

Advantageously, images in different directions around the image sensor package are captured. Accordingly, the image sensor package has a large field of view. Thus, the image sensor package is well-suited for applications conventionally requiring a moving video camera, e.g., in video surveillance applications.

These and other features and advantages of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
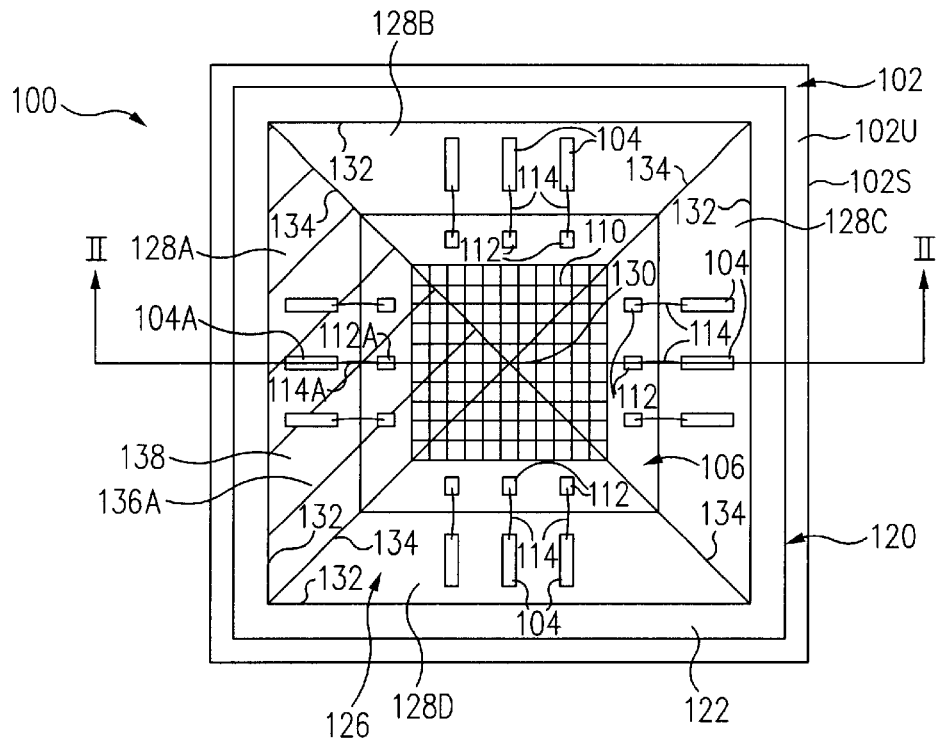
FIG. 1 is a top plan view of an image sensor package in accordance with one embodiment of the present invention.

In accordance with one embodiment of the present invention, a method of capturing an image 150 (FIG. 2) with an image sensor package 100 includes receiving electromagnetic radiation 140 of image 150. Electromagnetic radiation 140 is received at an angle to a line of sight 142 of an image sensor 106 of image sensor package 100.

Electromagnetic radiation 140 is reflected towards an active area 110 of image sensor 106 with a panel 128A of a reflector 126 of image sensor package 100. Electromagnetic radiation 140 strikes active area 110 and image sensor 106 captures image 150.

Advantageously, since electromagnetic radiation 140 is reflected on planar inner surface 128I of panel 128A, panel 128A does not distorted image 150 to any appreciable extent. Accordingly, image sensor package 100 readily captures image 150 at an angle to line of sight 142 of image sensor 106.

Figure 2:
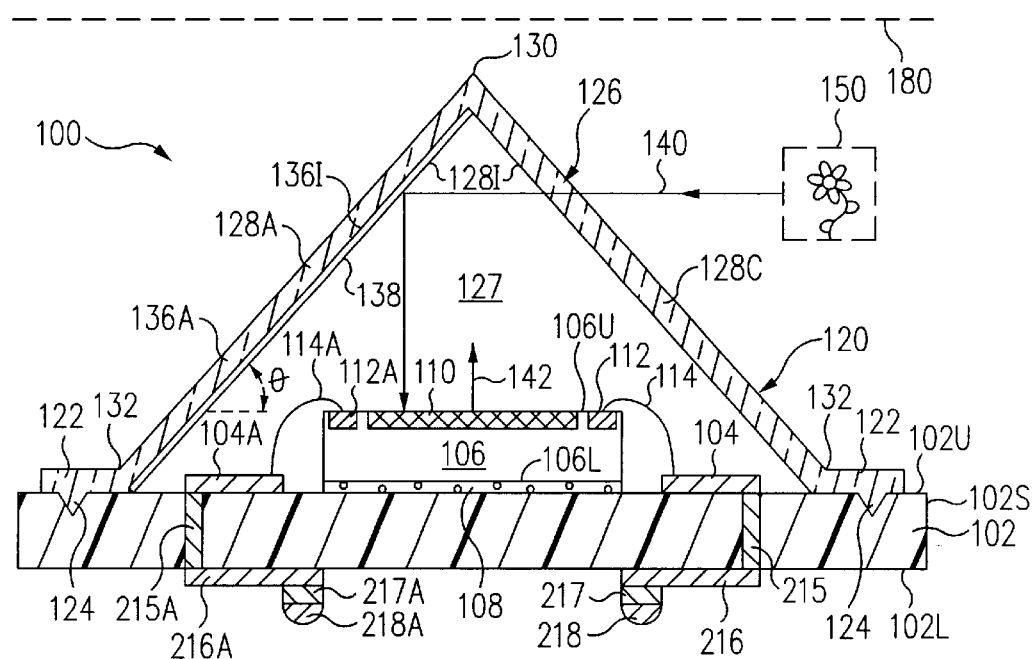
FIG. 2 is a cross-sectional view of the image sensor package taken along the line II—II of FIG. 1.

More particularly, FIG. 1 is a top plan view of an image sensor package 100 in accordance with one embodiment of the present invention. FIG. 2 is a cross-sectional view of package 100 taken along the line II—II of FIG. 1. Referring to FIGS. 1 and 2 together, package 100 includes a substrate 102 such as a liquid crystal polymer (LCP) substrate, a thermoplastic substrate, an alumina-based ceramic substrate, a printed circuit board substrate, a plastic glass laminated substrate, or a tape-based substrate. To minimize moisture ingress into package 100, in one embodiment, substrate 102 is a moisture resistant material, for example, is a liquid crystal polymer substrate.

Attached to an upper, e.g., first, surface 102U of substrate 102 is an image sensor 106. Illustratively, image sensor 106 is a CMOS image sensor device, a charge coupled device (CCD), a pyroelectric ceramic on CMOS device, or an erasable programmable read-only memory device (EPROM) although other image sensors are used in other embodiments.

In this embodiment, a lower, e.g., first, surface 106L of image sensor 106 is attached by an adhesive layer 108 to upper surface 102U of substrate 102 although other attachment techniques and/or materials, such as solder, are used in other embodiments.

Image sensor 106 includes an active area 110 on an upper, e.g., second, surface 106U of image sensor 106. Generally, active area 110 is responsive to radiation, e.g., electromagnetic radiation, as is well known to those of skill in the art. For example, active area 110 is responsive to infrared radiation, ultraviolet light, and/or visible light.

Image sensor 106 further includes a plurality of bond pads 112 on upper surface 106U of image sensor 106. Bond pads 112 are connected to internal circuitry of image sensor 106.

A plurality of electrically conductive traces 104 are formed on upper surface 102U of substrate 102. Bond pads 112 are electrically connected to corresponding traces 104 by electrically conductive bond wires 114.

As shown in FIG. 2, traces 104 are electrically connected to corresponding electrically conductive vias 215 which extend from upper surface 102U to a lower, e.g., second, surface 102L of substrate 102. Vias 215 are electrically connected to corresponding electrically conductive traces 216 on lower surface 102L of substrate 102.

Formed on traces 216 are corresponding electrically conductive pads 217. Formed on pads 217 are corresponding electrically conductive interconnection balls 218 such as solder balls. Interconnection balls 218 are used to electrically connect package 100 to a larger substrate (not shown) such as a printed circuit mother board.

As discussed further below, in one embodiment, it is important to prevent excessive heating of package 100. Thus, in accordance with this embodiment, interconnection balls 218 are electrically connected to the larger substrate using a socket or electrically conductive epoxy as are well known to those of skill in the art. More particularly, interconnection balls 218 are not reflowed, i.e., are not melted and resolidified, since reflowing might excessively heat and thus damage package 100.

Referring more particularly to FIG. 2, a first bond pad 112A of the plurality of bond pads 112 is electrically connected to a first trace 104A of the plurality of traces 104 by a first bond wire 114A of the plurality of bond wires 114. Trace 104A is electrically connected to a first via 215A of the plurality of vias 215. Via 215A is electrically connected to a first trace 216A of the plurality of traces 216. A first conductive pad 217A of the plurality of conductive pads 217 is formed on trace 216A. Formed on pad 217A is a first interconnection ball 218A of the plurality of interconnection balls 218.

As set forth above, an electrically conductive pathway between bond pad 112A and interconnection ball 218A is formed by bond wire 114A, trace 104A, via 215A, trace 216A and pad 217A. The other bond pads 112, bond wires 114, traces 104, vias 215, traces 216, pads 217 and interconnection balls 218 are electrically connected to one another in a similar fashion and so are not discussed further to avoid detracting from the principals of the invention.

Although a particular electrically conductive pathway between interconnection ball 218A and bond pad 112A is described above, in light of this disclosure, it is understood that other electrically conductive pathways can be formed. For example, substrate 102 is a multi-layered laminate substrate and, instead of straight-through vias 215, a plurality of electrically conductive traces on various layers in substrate 102 are interconnected by a plurality of electrically conductive vias to form the electrical interconnections between traces 104 and 216.

As a further example, vias 215 extend along a side 102S of substrate 102 and traces 104 and 216 extend to side 102S. As another alternative, interconnection balls 218 are distributed in an array format to form a ball grid array (BGA) type package. Alternatively, interconnection balls 218 are not formed, e.g., to form a metal land grid array (LGA) type package or a leadless chip carrier (LCC) package. Other electrically conductive pathway modifications will be obvious to those of skill in the art.

Further, although a particular number of bond pads 112, traces 104 and bond wires 114 are illustrated in FIG. 1, it is understood that more or less bond pads 112, traces 104, bond wires 114, vias 215, traces 216, pads 217 and interconnection balls 218 are typically used depending upon the particular input/output requirements of image sensor 106.

Package 100 further includes a reflector lid 120 mounted to substrate 102. More particularly, reflector lid 120 includes a base 122, which is mounted, e.g., ultrasonically welded or attached with adhesive, to a periphery of upper surface 102U adjacent side 102S. When viewed from above, base 122 is a rectangular, e.g., square, annulus.

To enhance the integrity of the seal between base 122 and upper surface 102U, in one embodiment, base 122 includes a plurality of projections 124 extending downwards towards substrate 102. Projections 124 are spikes, which penetrate into substrate 102.

By penetrate into substrate 102, projections 124 essentially eliminating any possibility of slippage of reflector lid 120 on substrate 102. Further, projections 124 increase the contact surface area between reflector lid 120 and substrate 102 thus enhancing the bond between reflector lid 120 and substrate 102.

Reflector lid 120 further includes a reflector 126 attached to base 122. In one embodiment, reflector lid 120 is metallized polycarbonate and is integral, i.e., is a single piece and not a plurality of separate pieces connected together.

Reflector lid 120 and substrate 102 define a sealed cavity 127. Image sensor 106 is located within sealed cavity 127 and thus protected from the ambient environment, e.g., dust and moisture. By forming reflector lid 120 of metallized polycarbonate and substrate 102 of liquid crystal polymer (LCP) in accordance with one embodiment, excellent moisture protection of image sensor 106 is obtained at a minimum cost. Further, liquid crystal polymer and metallized polycarbonate are materials that essentially do not generate particulates. Thus, reflector lid 120 and substrate 102 have a minimal possibility of contaminating active area 110 with particulates.

Generally, reflector 126 includes at least one planar panel having a planar inner surface. In this embodiment, reflector 126 includes four planar panels 128A, 128B, 128C, and 128D, collectively referred to as panels 128. Panels 128 are triangular and share a common apex 130. Bases 132 of panels 128 are connected to base 122 of reflector lid 120.

Panels 128 are connected to one another along and share sides 134 of panels 128 such that each base 132 is perpendicular to the base 132 of the adjacent panel 128. To illustrate, panel 128A shares a side 134 with panel 128B. Further, base 132 of panel 128A is perpendicular to base 132 of panel 128B. The other panels 128 are arranged in a similar manner and so are not discussed further to avoid detracting from the principals of the invention. In this embodiment, reflector 126 is a four-sided pyramid.

In accordance with this embodiment, panel 128A is reflective, at least partially, to the electromagnetic radiation of interest, i.e., to the electromagnetic radiation which active area 110 of image sensor 106 is responsive. Generally, panel 128A, hereinafter referred to as reflective panel 128A, is sufficiently reflective to reflect a necessary minimum amount of electromagnetic radiation necessary for the proper operation of image sensor 106.

Further, an angle θ between a plane defined by upper surface 106U of image sensor 106 and a plane defined by inner surface 128I of reflective panel 128A is selected to provide proper reflection of an image 150 on to active area 110 as described further below. Stated another way, inner surface 128I of reflective panel 128A is angled relative to upper surface 106U of image sensor 106 to reflect image 150 on to active area 110.

In one embodiment, reflective panel 128A includes a body 136A, e.g., polycarbonate. Reflective panel 128A further includes a metallization 138, e.g., deposited aluminum or other metal or metal containing material, on an inner surface 136I of body 136A. Metallization 138 defines inner surface 128I of reflective panel 128A. Metallization 138 is a mirror, which makes reflective panel 128A reflective.

During use, electromagnetic radiation 140 is received by package 100 at an angle, e.g., 90 degrees, to a line of sight 142 of image sensor 106. As used herein, line of sight 142 of image sensor 106 is a line originating from active area 110 and normal, i.e., perpendicular, to upper surface 106U of image sensor 106.

Electromagnetic radiation 140 strikes and passes through panel 128C, which is transparent to electromagnetic radiation 140. Electromagnetic radiation 140 strikes reflective panel 128A, which reflects electromagnetic radiation 140 downwards towards active area 110. Electromagnetic radiation 140 strikes active area 110, which responds to electromagnetic radiation 140 and image sensor 106 captures image 150 as those of skill in the art will understand.

As described above, package 100 is used to capture image 150, which is received by package 100 as electromagnetic radiation 140. For example, package 100 is used in consumer camera applications or in video camera applications. In accordance with this embodiment, it is important that image 150 is undistorted by reflector lid 120. Stated another way, is important that reflective panel 128A reflects image 150 to active area 110 in a manner that prevents distortion of image 150.

Advantageously, since inner surface 128I of reflective panel 128A is planar, reflective panel 128A does not distorted image 150 to any appreciable extent. Accordingly, package 100 readily captures image 150 at an angle to line of sight 142 of image sensor 106.

In one embodiment, package 100 is formed with an opaque shield 180 above reflector lid 120. Opaque shield 180 shields active area 110 from undesirable electromagnetic radiation coming from above package 100 which otherwise could produce a double image or otherwise degrade the image captured by package 100. Illustratively, opaque shield 180 is supported, e.g., with pins, clips and/or other fasteners, on substrate 102, reflector lid 120 and/or on a structure separate from package 100 or otherwise supported.

In one embodiment, active area 110 of image sensor 106 transmits radiation such as electromagnetic radiation. For example, image sensor 106 is a light emitting diode (LED) micro-display. In accordance with this embodiment, electromagnetic radiation transmitted by active area 110 is reflected from reflective panel 128A and emanates from package 100. Illustratively, an image is projected from package 100.

For simplicity, in the above and following discussions, active area 110 as a receiver of radiation is set forth. However, in light of this disclosure, those of skill in the art will recognize that generally active area 110 can be a receiver of radiation, a transmitter of radiation, or a transceiver, i.e., a transmitter and a receiver, of radiation.

Figure 3:
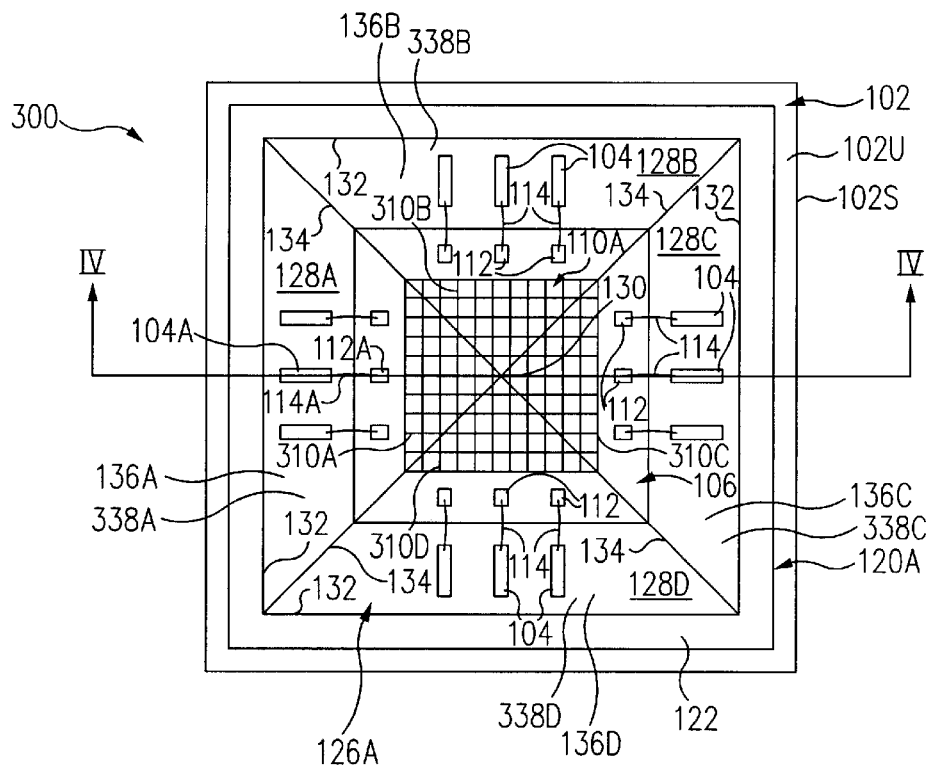
FIG. 3 is a top plan view of an image sensor package in accordance with an alternative embodiment of the present invention.
Figure 4:
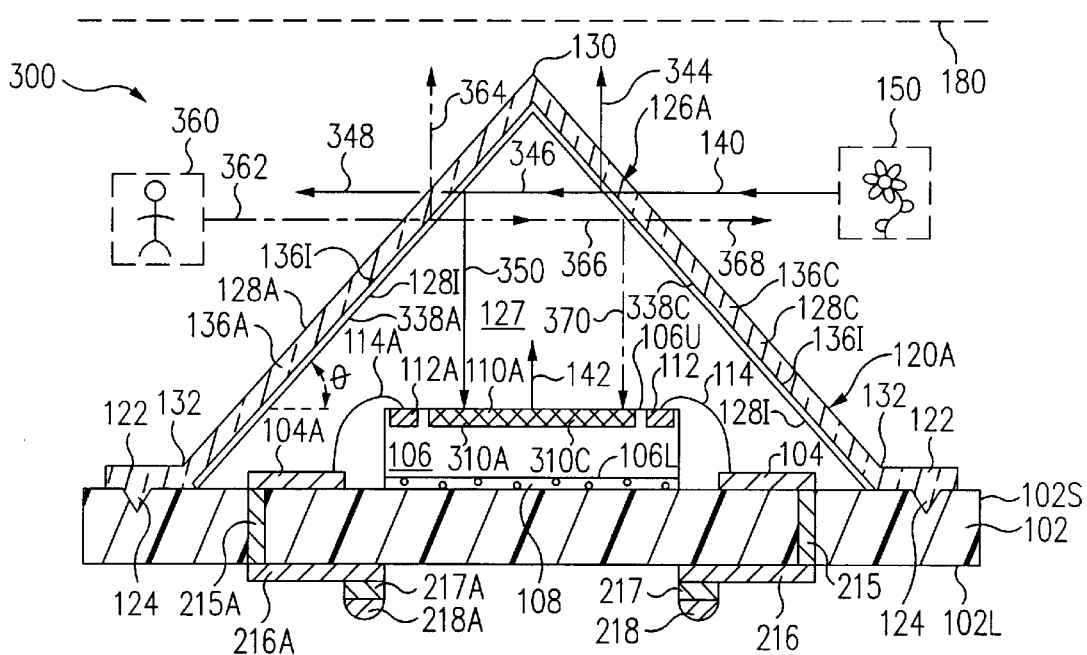
FIG. 4 is a cross-sectional view of the image sensor package taken along the line IV—IV of FIG. 3.

FIG. 3 is a top plan view of an image sensor package 300 in accordance with an alternative embodiment of the present invention. FIG. 4 is a cross-sectional view of package 300 taken along the line IV—IV of FIG. 3. Package 300 of FIGS. 3 and 4 is similar to package 100 of FIGS. 1 and 2 and only the significant differences are discussed below.

Referring now to FIGS. 3 and 4 together, in accordance with this embodiment, a reflector 126A of a reflector lid 120A is partially reflective and partially transparent to the electromagnetic radiation of interest. More particularly, panels 128A, 128B, 128C, 128D are partially reflective and partially transparent, sometimes called partially mirrored. Panels 128A, 128B, 128C, 128D are hereinafter referred to as partially reflective panels 128A, 128B, 128C, 128D and collectively referred to as partially reflective panels 128.

Illustratively, partially reflective panels 128A, 128B, 128C, 128D include transparent bodies 136A, 136B, 136C, 136D, e.g., polycarbonate, and partially reflective metallizations 338A, 338B, 338C, 338D, e.g., deposited aluminum or other metal or metal containing material, on inner surfaces 136I of transparent bodies 136A, 136B, 136C, 136D, respectively. Illustratively, an integral piece of polycarbonate forms transparent bodies 136A, 136B, 136C, 136D and an integral deposited aluminum or other metal or metal containing material on the integral piece of polycarbonate forms partially reflective metallizations 338A, 338B, 338C, 338D.

During use, electromagnetic radiation 140 is received by package 300 at an angle, e.g., 90 degrees, to line of sight 142 of image sensor 106. Electromagnetic radiation 140 strikes partially reflective panel 128C, which is opposite of partially reflective panel 128A. Electromagnetic radiation 140 passes through transparent body 136C and strikes partially reflective metallization 338C. A first portion 344 of electromagnetic radiation 140 is reflected upwards and away from package 300. A second portion 346 of electromagnetic radiation 140, hereinafter electromagnetic radiation 346, passes through partially reflective metallization 338C. Electromagnetic radiation 346 is sometimes called at least a first portion of electromagnetic radiation 140.

Electromagnetic radiation 346 strikes partially reflective panel 128A. Partially reflective panel 128A and, more particularly, partially reflective metallization 338A, reflects a first portion 350 of electromagnetic radiation 346, hereinafter electromagnetic radiation 350, downwards towards an active area 110A of image sensor 106. Electromagnetic radiation 350 is sometimes called at least a second portion of electromagnetic radiation 140. A second portion 348 of electromagnetic radiation 346 passes through partially reflective panel 128A and, more particularly, through partially reflective metallization 338A and transparent body 136A.

In accordance with this embodiment, active area 110A is subdivided into four active sub-areas 310A, 310B, 310C, 310D, which correspond to partially reflective panels 128A, 128B, 128C, 128D, respectively. As discussed further below, active sub-areas 310A, 310B, 310C, 310D receive electromagnetic radiation from partially reflective panels 128A, 128B, 128C, 128D, respectively. In one embodiment, active sub-areas 310A, 310B, 310C, 310D are separate from one another instead of being part of a single active area 110A.

Electromagnetic radiation 350 reflected from partially reflective panel 128A strikes active sub-area 310A of active area 110A, which responds to electromagnetic radiation 350 as is well known to those of skill in the art. For reasons similar to those discussed above, image 150, which is received by package 300 as electromagnetic radiation 140, is captured by package 300.

Further, in accordance with this embodiment, a second image 360 is captured by package 300 simultaneous with image 150. Image 360 is received by package 300 as electromagnetic radiation 362 as discussed below.

More particularly, electromagnetic radiation 362 is received by package 300 at an angle, e.g., 90 degrees, to line of sight 142 of image sensor 106. Illustratively, electromagnetic radiation 362 travels to package 300 in a direction opposite that of electromagnetic radiation 140.

Electromagnetic radiation 362 strikes partially reflective panel 128A. Electromagnetic radiation 362 passes through transparent body 136A and strikes partially reflective metallization 338A. A first portion 364 of electromagnetic radiation 362 is reflected upwards and away from package 300. A second portion 366 of electromagnetic radiation 362, hereinafter electromagnetic radiation 366, passes through partially reflective metallization 338A. Electromagnetic radiation 366 is sometimes called at least a first portion of electromagnetic radiation 362.

Electromagnetic radiation 346 strikes partially reflective panel 128C. Partially reflective panel 128C and, more particularly, partially reflective metallization 338C, reflects a first portion 370 of electromagnetic radiation 366, hereinafter electromagnetic radiation 370, downwards towards active area 110A of image sensor 106. Electromagnetic radiation 370 is sometimes called at least a second portion of electromagnetic radiation 362. A second portion 368 of electromagnetic radiation 366 passes through partially reflective panel 128C and, more particularly, through partially reflective metallization 338C and transparent body 136C.

Electromagnetic radiation 370 strikes active sub-area 310C of active area 110A, which responds to electromagnetic radiation 370 as is well known to those of skill in the art. For reasons similar to those discussed above, image 360, which is received by package 300 as electromagnetic radiation 362, is captured by package 300.

Partially reflective panels 128B, 128D reflect electromagnetic radiation to active sub-areas 310B, 310D of active area 110A, respectively, in a similar manner and so are not discussed further to avoid detracting from the principals of the invention. Advantageously, images from four different directions, i.e., in a 360-degree view, around package 300 are captured by package 300. Stated another way, package 300 has a 360-degree field of view. Thus, package 300 is well-suited for applications conventionally requiring a moving video camera, e.g., in video surveillance applications.

Figure 5:
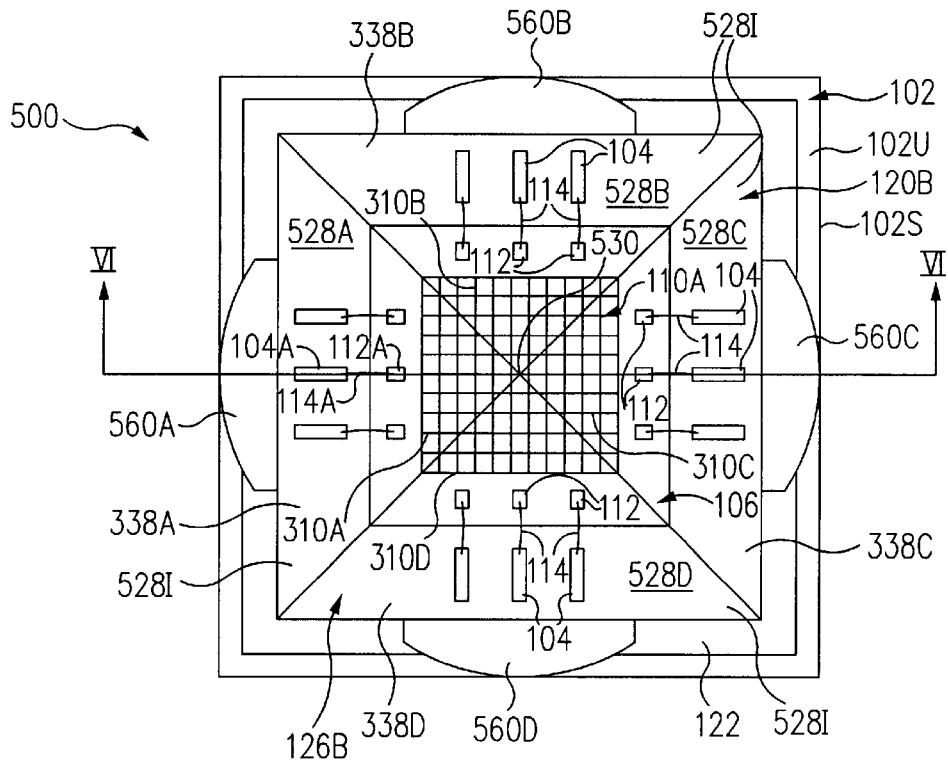
FIG. 5 is a top plan view of an image sensor package in accordance with yet another alternative embodiment of the present invention.
Figure 6:
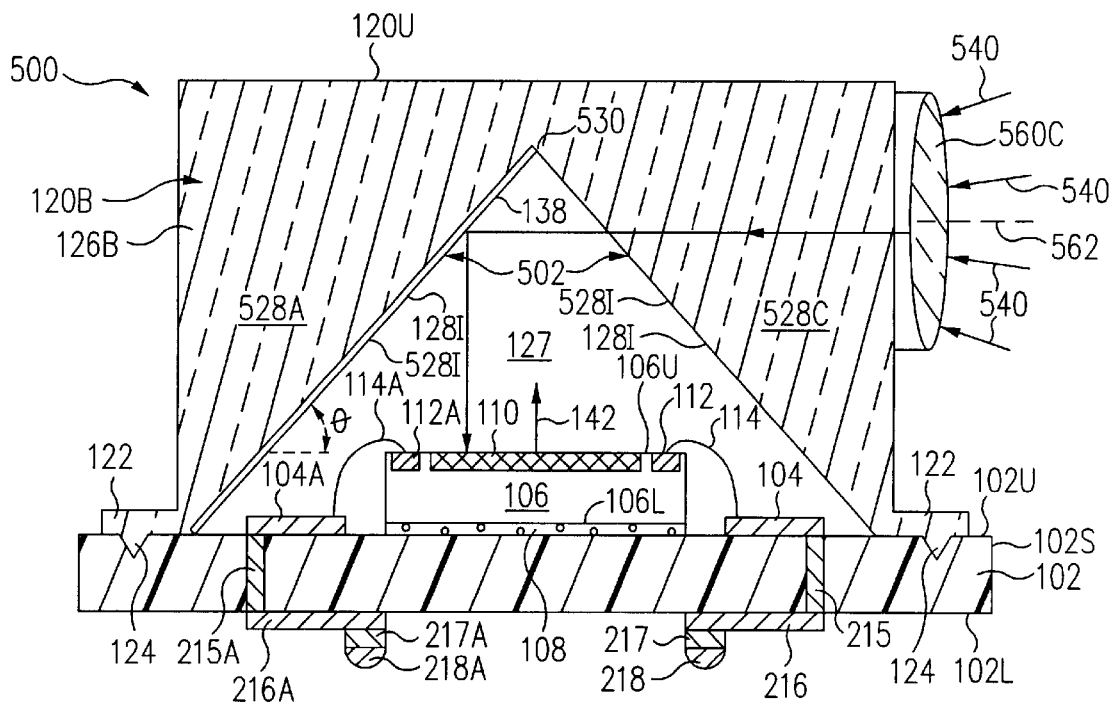
FIG. 6 is a cross-sectional view of the image sensor package taken along the line VI—VI of FIG. 5.

FIG. 5 is a top plan view of an image sensor package 500 in accordance with yet another alternative embodiment of the present invention. FIG. 6 is a cross-sectional view of package 500 taken along the line VI—VI of FIG. 5. Package 500 of FIGS. 5 and 6 is similar to package 100 of FIGS. 1 and 2 and only the significant differences are discussed below.

Referring now to FIGS. 5 and 6 together, in accordance with this embodiment, a reflector 126B of a reflector lid 120B is a rectangular, e.g., square, block having a pyramid shaped inner surface 502.

Reflector 126B includes four panels 528A, 528B, 528C, 528D, collectively panels 528. Panels 528 including planer inner surfaces 528I, which collectively define pyramid shaped inner surface 502 of reflector 126B. Inner surfaces 528I of panels 528 are triangular shaped and have a common apex 530.

In accordance with this embodiment, a wide-angle lens 560C is integrally formed with or mounted to panel 528C. An optical axis 562 of wide-angle lens 560C is perpendicular to line of sight 142.

FIGS. 5 and 6 illustrate alterative embodiments of package 500. In light of this disclosure, it is understood that package 500 is fabricated in accordance with either embodiment.

In the embodiment illustrated in FIG. 6, inner surface 528I of panel 528A is mirrored by metallization 138. In accordance with this embodiment, electromagnetic radiation 540 received by package 500 is focused by wide-angle lens 560C and reflected by panel 528A to active area 110 in a manner similar to that described above with regards to electromagnetic radiation 140 and package 100 of FIGS. 1 and 2. Advantageously, a wide-angle view is captured by package 500.

In the embodiment illustrated in FIG. 5, inner surfaces 528I of panels 528A, 528B, 528C, 528D are partially mirrored, e.g., by partially reflective metallizations 338A, 338B, 338C, 338D, respectively. In accordance with this embodiment, wide-angle lens 560A, 560B, 560C, 516D are integrally formed with or mounted to panels 528A, 528B, 528C, 528D, respectively.

During use, electromagnetic radiation is focused by wide-angle lenses 560A, 560B, 560C, and 560D. This electromagnetic radiation passes through panels 528A, 528B, 528C, 528D and is reflected by inner surfaces 528I of panels 528C, 528D, 528A, 528B to active sub-areas 310C, 310D, 310A, 310B of active area 110A, respectively, in a manner similar to that described above with regards to electromagnetic radiation 140, 362 and package 300 of FIGS. 3 and 4. Advantageously, wide-angle views of images from four different directions, i.e., in a 360 degree view, around package 500 are captured by package 500.

Referring now to FIG. 6, an upper surface 120U of reflector lid 120B is parallel to upper surface 106U of image sensor 106. Upper surface 120U is opaque to the electromagnetic radiation of interest. Advantageously, active area 110 is shielded by upper surface 120U from undesirable electromagnetic radiation coming from above package 500 which otherwise could produce a double image or otherwise degrade the image(s) captured by package 500.

Figure 7:
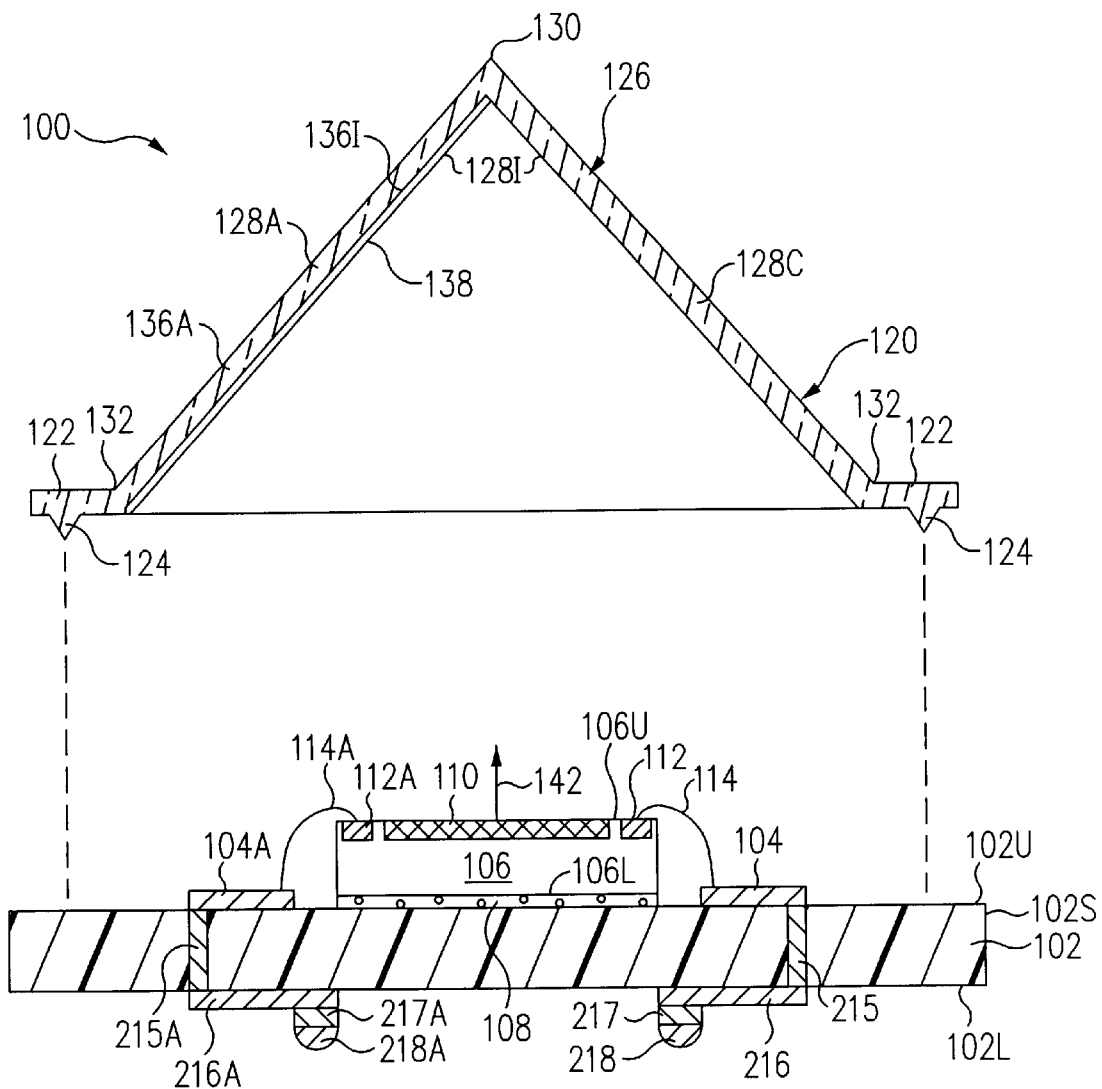
FIG. 7 is a cross-sectional view of an image sensor package during fabrication in accordance with one embodiment of the present invention.

FIG. 7 is a cross-sectional view of package 100 during fabrication in accordance with one embodiment of the present invention. Referring now to FIG. 7, traces 104, 216, vias 215, pads 217 and interconnection balls 218 are formed. Advantageously, interconnection balls 218 are formed prior to mounting of reflector lid 120 to substrate 102 thus eliminating any possibility of melting or otherwise damaging reflector lid 120 during the formation of interconnection balls 218.

Image sensor 106 is attached to substrate 102 by adhesive layer 108. More particularly, lower surface 106L of image sensor 106 is mounted to upper surface 102U of substrate 102 by adhesive layer 108.

Bond pads 112 of image sensor 106 are electrically connected to corresponding traces 104 by corresponding bond wires 114. For example, bond pad 112A is electrically connected to a corresponding trace 104A by bond wire 114A. The other bond pads 112 are connected to the other corresponding traces 104 by the other bond wires 114 a similar manner.

Reflector lid 120 is fabricated. In one embodiment, to form reflector lid 120, polycarbonate is molded or otherwise shaped to integrally form base 122 and body 136A, panels 128B, 128C, 128D of reflector 126. Metallization 138 is formed on inner surface 136I of body 136A, e.g., by evaporation or sputtering of aluminum or other metal or a metal containing material. However, reflector lid 120 is fabricated using other techniques in other embodiments.

Reflector lid 120 is aligned with substrate 102 using any one of a number of alignment techniques, e.g., is optically or mechanically aligned. Reflector lid 120 is moved and brought into abutting contact with substrate 102 such that projections 124 penetrate into upper surface 102U of substrate 102 as shown in FIG. 2. Base 122 is then welded, e.g., ultrasonically, or otherwise mounted, e.g., with adhesive, to upper surface 102U of substrate 102 completing fabrication of package 100. Advantageously, base 122 is mounted to upper surface 102U of substrate 102 without excessively heating and thus possibly damaging reflector lid 120, e.g., reflector lid 120 is kept below 120° C. during mounting.

Packages 300, 500 of FIGS. 3, 4 and 5, 6 are fabricated in a manner similar to that discussed above with regards to package 100. However, referring to package 500 of FIG. 5, lenses 560 are integrally formed with reflector lid 120B or, alternatively, lenses 560 are separate structures, which are mounted to reflector 120B.

This application is related to Glenn et al., co-filed and commonly assigned U.S. patent application Ser. No. 09/906, 992, entitled "IMAGE SENSOR PACKAGE WITH REFLECTOR", which is herein incorporated by reference in its entirety.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
   coupling a first surface of an image sensor to a first surface of a substrate;
   forming a reflector lid comprising a first panel, wherein said first panel is at least partially reflective;
   coupling said reflector lid with said first surface of said substrate comprising locating said image sensor within a sealed cavity defined by said reflector lid and said substrate;
   receiving radiation comprising an image at an angle to a line of sight of said image sensor; and
   reflecting said radiation towards an active area of said image sensor with said first panel, wherein said radiation strikes said active area and said image sensor captures said image.

2. The method of claim 1 wherein said reflector lid comprises a second panel, said method further comprising passing said radiation through said second panel.

3. The method of claim 2 wherein said second panel is transparent.

4. The method of claim 2 further comprising focusing said radiation with a lens coupled to said second panel.

5. The method of claim 4 wherein said lens is a wide-angle lens.

6. The method of claim 1 wherein said first panel comprises a body and a metallization on an inner surface of said body.

7. The method of claim 6 wherein said metallization is a mirror which makes said first panel reflective.

8. A method comprising:
   coupling a first surface of an image sensor to a first surface of a substrate;
   forming a reflector lid comprising a first partially reflective panel and a second partially reflective panel;
   coupling said reflector lid with said first surface of said substrate comprising locating said image sensor within a sealed cavity defined by said reflector lid and said substrate;
   receiving a first radiation comprising an image at an angle to a line of sight of said image sensor;
   reflecting a first portion of said first radiation away from said image sensor with said first partially reflective panel, wherein a second portion of said first radiation passes through said first partially reflective panel, said second portion forming a second radiation; and
   reflecting a first portion of said second radiation towards an active area of said image sensor with said second partially reflective panel, wherein said first portion of said second radiation strikes said active area and said image sensor captures said image.

9. The method of claim 8 further comprising passing a second portion of said second radiation through said second partially reflective panel.

10. A method of capturing a first image and a second image with an image sensor package comprising:
    receiving a first radiation comprising said first image at an angle to a line of sight of an image sensor of said image sensor package;

passing at least a first portion of said first radiation through a first partially reflective panel of said image sensor package;

reflecting at least a second portion of said first radiation towards an active area of said image sensor with a second partially reflective panel of said image sensor package, wherein said at least a second portion of said first radiation strikes said active area and said image sensor captures said first image;

receiving a second radiation comprising said second image at an angle to said line of sight;

passing at least a first portion of said second radiation through said second partially reflective panel; and reflecting at least a second portion of said second radiation towards said active area of said image sensor with said first partially reflective panel, wherein said at least a second portion of said second radiation strikes said active area and said image sensor captures said second image.

11. The method of claim 10 wherein said active area comprises a first active sub-area and a second active sub-area, wherein said at least a second portion of said first radiation strikes said second active sub-area and wherein said at least a second portion of said second radiation strikes said first active sub-area.

12. The method of claim 10 wherein said first image and said second image are captured by said image sensor package simultaneously.

13. A method comprising:

coupling a first surface of an image sensor to a first surface of a substrate;

forming a reflector lid comprising a first panel comprising a planar surface, said planar surface being at least partially reflective;

aligning said reflector lid with said substrate; and coupling said reflector lid to said first surface of said substrate, wherein said planar surface is angled relative to a second surface of said image sensor, said second surface comprising an active area.

14. The method of claim 13 wherein said substrate comprises liquid crystal polymer (LCP).

15. The method of claim 14 wherein said reflector lid comprises metallized polycarbonate.

16. The method of claim 15 wherein said coupling said reflector lid to said first surface of said substrate comprises ultrasonically welding said reflector lid to said substrate.

17. The method of claim 16 wherein a temperature of said reflector lid remains below 120° C. during said coupling said reflector lid to said first surface of said substrate.

18. The method of claim 13 wherein said coupling said reflector lid to said first surface of said substrate comprises locating said image sensor within a sealed cavity defined by said reflector lid and said substrate.

19. The method of claim 13 wherein said coupling said reflector lid to said first surface of said substrate comprises coupling a base of said reflector lid to a periphery of said first surface of said substrate.

20. The method of claim 19 wherein said base comprises projections, said coupling said reflector lid to said first surface of said substrate further comprising penetrating said projections into said substrate.

21. The method of claim 20 wherein said projections are spikes.

* * * * *